(12) United States Patent
Min et al.

(10) Patent No.: US 7,330,384 B2
(45) Date of Patent: Feb. 12, 2008

(54) VERIFYING CIRCUIT AND METHOD OF REPAIRING SEMICONDUCTOR DEVICE

(75) Inventors: Young-Sun Min, Seoul (KR);
Jong-Hyun Choi, Gyeonggi-do (KR);
Nam-Jong Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 113 days.

(21) Appl. No.: 11/261,497

(22) Filed: Oct. 31, 2005

(65) Prior Publication Data
US 2006/0092729 A1    May 4, 2006

(30) Foreign Application Priority Data
Nov. 3, 2004    (KR) .................. 10-2004-0088585

(51) Int. Cl.
*G11C 7/00*    (2006.01)
(52) U.S. Cl. .............. 365/201; 365/225.7; 365/185.22
(58) Field of Classification Search ............... 365/201, 365/225.7, 185.22
See application file for complete search history.

(56) References Cited

U.S. PATENT DOCUMENTS

| | | | |
|---|---|---|---|
| 5,982,656 A | 11/1999 | Cutter et al. | |
| 6,240,033 B1 | 5/2001 | Yang et al. | |
| 6,603,689 B2 * | 8/2003 | Kato et al. | 365/200 |
| 6,850,450 B2 * | 2/2005 | Bang et al. | 365/225.7 |
| 6,865,123 B2 * | 3/2005 | Lee | 365/200 |

FOREIGN PATENT DOCUMENTS

| | | |
|---|---|---|
| KR | 10-0328447 | 2/2002 |
| KR | 1020020062438 A | 2/2002 |

OTHER PUBLICATIONS

Korean Search Report.

* cited by examiner

*Primary Examiner*—Anh Phung
*Assistant Examiner*—Nam Nguyen
(74) *Attorney, Agent, or Firm*—Harness, Dickey & Pierce, P.L.C.

(57) ABSTRACT

A verifying circuit and a method of repairing a semiconductor device, the verifying circuit of example embodiments may include a first fuse circuit configured to determine whether a first fuse has been programmed, a test signal generating circuit configured to generate a test signal based on a control signal and an output signal from the first fuse circuit, and a second fuse circuit configured to test whether a plurality of second fuses are programmed based on the test signal.

24 Claims, 4 Drawing Sheets

VERIFYING CIRCUIT AND METHOD OF REPAIRING SEMICONDUCTOR DEVICE

CLAIM OF PRIORITY

A claim of priority is made to Korean Patent Application No. 2004-88585 filed on Nov. 3, 2004, the contents of which are herein incorporated by reference in their entirety.

BACKGROUND OF THE INVENTION

1. Field of the Invention

Example embodiments of the present invention generally relate to a method of repairing a semiconductor device, and a circuit to verifying the repair, and more particularly, to a method of repairing a semiconductor device by verifying a programming of a fuse, and a circuit to verify the fuse programming.

2. Description of the Related Art

A manufactured semiconductor memory device having a defective memory cell may not operate properly and the defective semiconductor memory devices may be discarded. Considering production yield, however, discarding semiconductor memory devices having only a few defective memory cells may not be cost effective. Accordingly, when a semiconductor memory device has only a few defective memory cells, the defective memory cells may be repaired by replacing the defective memory cell with redundant memory cells, which may be designed into the semiconductor memory device.

In general, a repair operation using the redundant memory cell may be performed in such a way that a spare row and a spare column are provided at fixed cell array intervals, and defective memory cells are replaced with the spare memory cells on a row/column basis. For example, when a defective memory cell is detected after a wafer process, a programming operation to replace a defective address with an address of a corresponding spare cell may be performed by an internal circuit. Accordingly, when an address signal corresponding to a defective line may be input during an actual operation, a spare line is accessed instead of the defective line.

In the conventional art, a fuse may be used during a programming operation to replace a defective memory cell with a spare memory cell. In order to perform the programming operation, several methods have been used, for example, a method of cutting off the fuse by applying an overcurrent thereto, a method of burning and cutting the fuse by applying a laser beam thereto, a method of interconnecting junctions by using a laser beam, and a method of programming for example an erasable programmable read-only memory (EPROM). Among the above methods, the laser cutting method has been widely used, because the method is simple and reliable. This method may use a fuse made of a polysilicon wire or metal wire.

However, the laser cutting method is usually performed to repair a defective semiconductor memory device at a wafer level, and may be difficult to use when a defective memory cell is detected at a package level.

In order to solve the above problem, an anti-fuse capable of being programmed at a package level has been proposed.

In general, an anti-fuse may have a higher resistance in an non-programmed state but may have a low resistance in a programmed state. An anti-fuse may be configured to include two conductive layers and a dielectric layer interposed between the conductive layers. The dielectric layer may be made of a dielectric material such as SiO2, silicon nitride, tantalum oxide, and silicon dioxide-silicon nitride-silicon dioxide (ONO). An anti-fuse may be programmed in such a way that a high voltage is applied between both terminals of the anti-fuse to destroy the dielectric layer between the two conductive layers. Accordingly, the programmed anti-fuse may have a lower resistance between both of its terminals.

Address fuses corresponding to word lines and master fuses corresponding to the address fuses may be used to repair a defective semiconductor memory device. That is, the address fuses may be programmed to correspond to an address corresponding to a defective word line, wherein a spare line is selected when the address may be selected. Also, a master fuse corresponding to the programmed address fuse is programmed to allow the programmed address fuse to be used. If the master fuse is not programmed to allow the programmed address fuse to be used, the cell repair operation through the programmed address is not completed.

In a conventional fuse programming method to repair a defective cell, the address fuse and the master fuse are usually simultaneously programmed. Accordingly, if the semiconductor memory device does not operate normally after the fuse programming operation, it may be difficult to determine which fuse was not properly programmed. This problem may become more serious when the semiconductor memory device requires repair at a package level using an anti-fuse.

SUMMARY OF THE INVENTION

In an embodiment of the present invention, a method of repairing a defective memory cell includes programming a first fuse, testing whether the first fuse has been successfully programmed, and programming a second fuse based on a test result of the first fuse.

In another embodiment of the present invention, a verifying circuit including a first fuse circuit configured to determine whether a first fuse has been programmed, a test signal generating circuit configured to generate a test signal based on a control signal and an output signal from the first fuse circuit, and a second fuse circuit configured to test whether a plurality of second fuses are programmed based on the test signal.

In an example of the present invention, a verifying circuit includes a first fuse circuit configured to determine whether a first fuse has been programmed. The first fuse circuit includes a first switch unit configured to switch between a first fuse node and a first latch node, a first fuse unit configured to change a voltage of the first fuse node depending on a current flowing through the first switch unit based on whether the first fuse is programmed, and a first latch unit configured to precharge the first latch node and configured to latch a voltage of the first latch node. The verifying circuit also includes a test signal generating circuit configured to generate a test signal based on a control signal and an output signal from the first fuse circuit, and a second fuse circuit including a plurality of determining circuits configured to test whether a plurality of second fuses are programmed based on the test signal. The plurality of determining circuits includes a second switch unit configured to switch between a second fuse node and a second latch node, a second fuse unit configured to change a voltage of the second fuse node depending on a current flowing through the second switch unit based on whether the second fuse is programmed, and a second latch unit configured to precharge the second latch node and configured to latch a voltage of the second latch node.

BRIEF DESCRIPTION OF THE DRAWINGS

The present invention will become more apparent with the description of example embodiments thereof with reference to the accompanying drawings, in which.

DESCRIPTION OF THE EXAMPLE EMBODIMENTS

Figure 1:
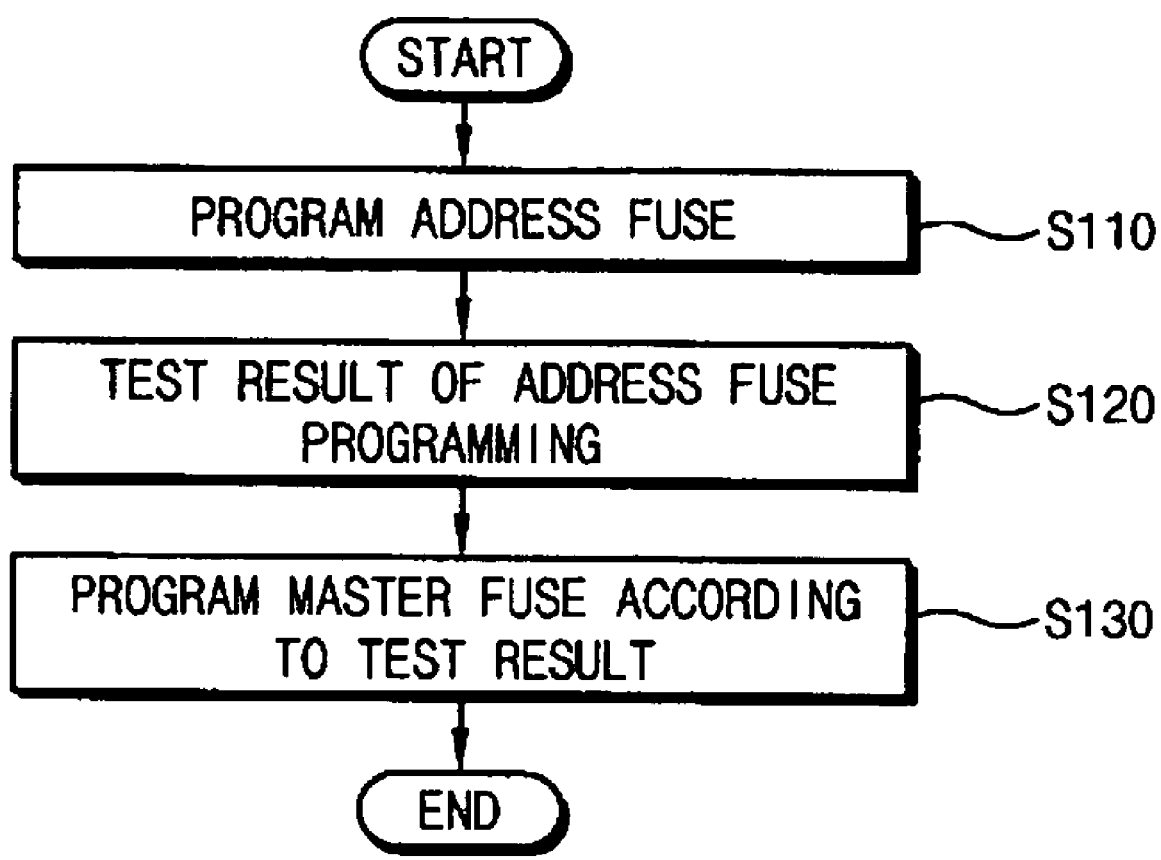
FIG. 1 is a flow chart illustrating a method of programming a first fuse according to an embodiment of the present invention.

Hereinafter, the example embodiments of the present invention will be described in detail with reference to the accompanying drawings.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

FIG. 1 is a flow chart illustrating a method of programming a first fuse according to an example embodiment of the present invention.

Referring to FIG. 1, a first fuse may be programmed at S110. For explanation purposes, a first fuse may be an address fuse, and a second fuse may be a master fuse. It is also understood the first and second designation may be interchanged.

Address fuse programming may be performed so that both terminals of the address fuse are electrically shorted or electrically opened. For example, when an anti-fuse is used as the address fuse, both terminals of the anti-fuse may be electrically shorted by applying a high voltage therebetween, or may be electrically opened by applying no voltage therebetween.

At S120, the fuse may be tested to determine whether the address fuse has been successfully programmed. For example, the fuse may be tested to determine whether the address fuse has been programmed with respect to a corresponding address of a defective word line.

Figure 2:
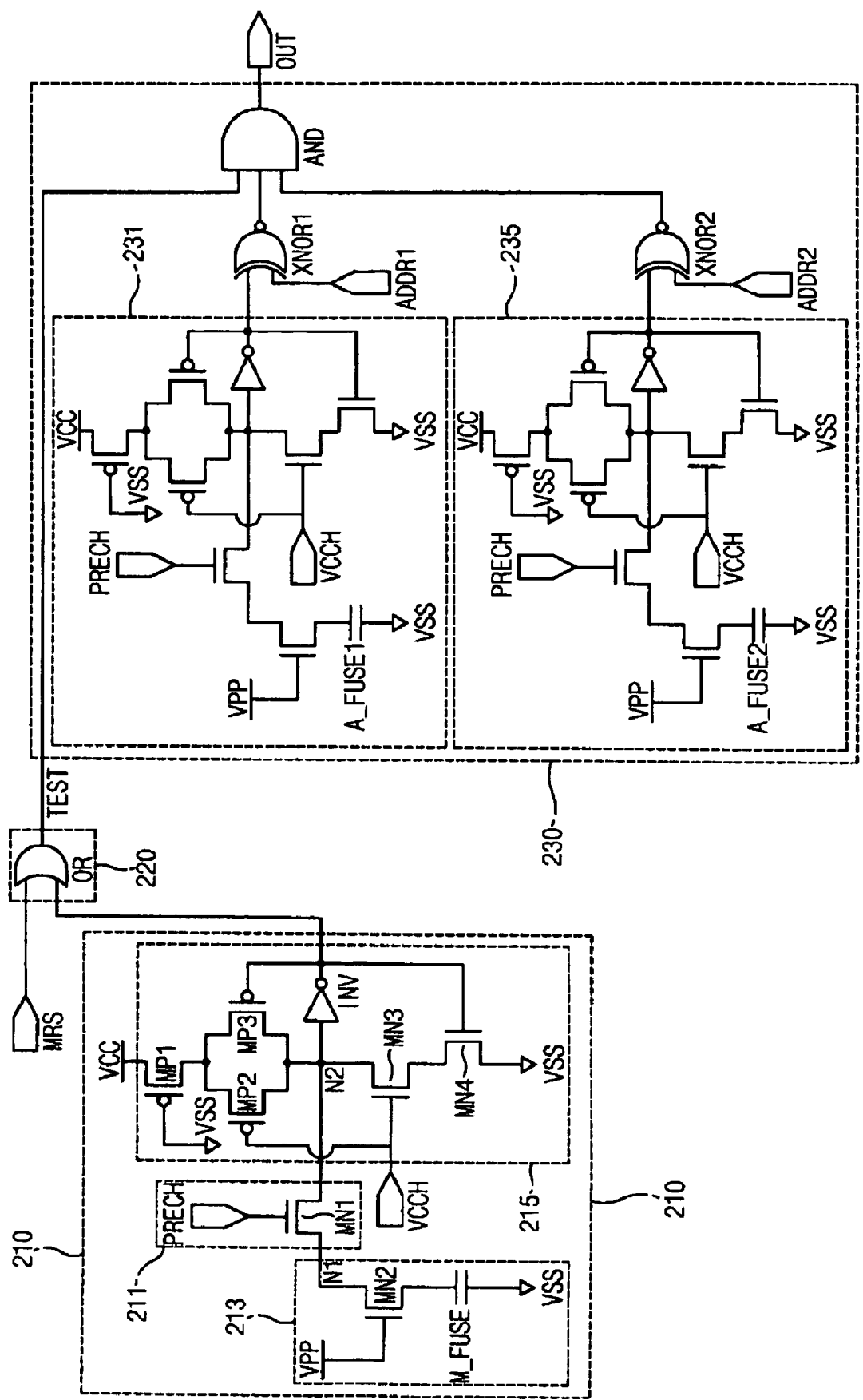
FIG. 2 is a diagram of a circuit to verify fuse programming according to an example embodiment of the present invention.
Figure 4:
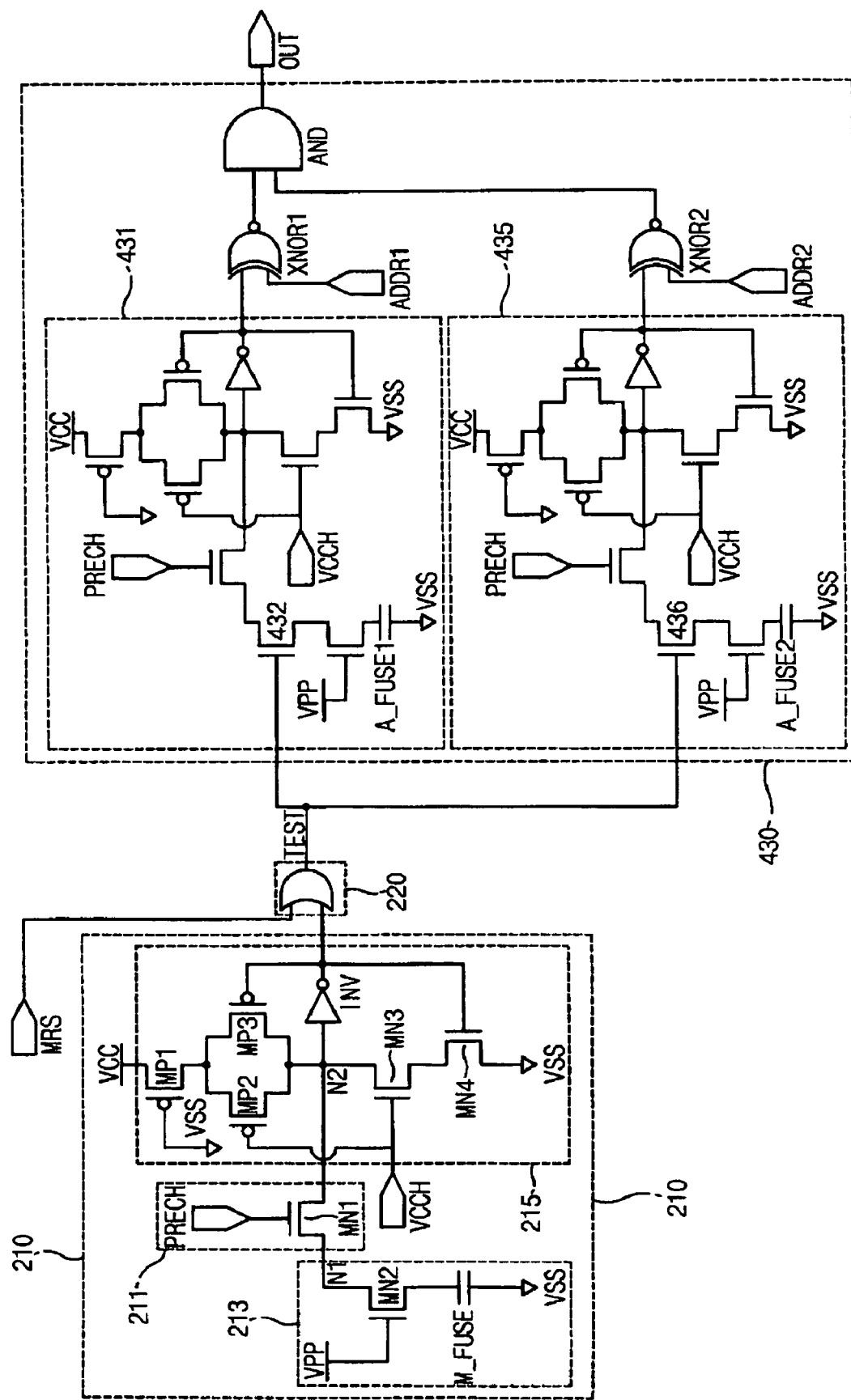
FIG. 4 is a diagram of a circuit to verify fuse programming according to another example embodiment of the present invention.

The address fuse may be tested by using a control signal regardless of a programming status of the master fuse. The control signal may be a mode register set (MRS) signal as illustrated in FIGS. 2 and 4.

S130, the master fuse may be programmed according to the results of the address fuse programming.

For example, if the address fuse corresponding to an address of a defective word line had been improperly programmed, the master fuse may be programmed to prevent the improperly-programmed address fuse from being used. However, if the address fuse corresponding to the address of the defective word line had been successfully programmed, the master fuse may be programmed to allow the successfully-programmed address fuse to be used.

In addition to S110 to S130, the fuse programming method may further include an operation of testing the master fuse programming.

FIG. 2 is a diagram of a circuit to verify fuse programming according to an example embodiment of the present invention.

Referring to FIG. 2, the verifying circuit may include a master fuse circuit 210, a test signal generating circuit 220, and an address fuse circuit 230.

The master fuse circuit 210 may include a switch unit 211, a fuse unit 213, and a latch unit 215, and the master fuse circuit 210 may determine whether a master fuse has been properly programmed.

The switch unit 211 may include an NMOS transistor MN1 and adapted to switch between a master fuse node N1 and a master latch node N2. A switching signal PRECH may be applied to a gate of the NMOS transistor MN1, and the master fuse node N1 and the master latch node N2 may be connected to a source and a drain of the NMOS transistor MN1, respectively.

The switching signal PRECH may be generated by a source voltage VCC. As the source voltage VCC increases during an initial duration period, the switching signal PRECH also increases. After the source voltage VCC reaches and maintains a constant level after the initial duration period, the switching signal PRECH maintains a constant level for a given duration period. Accordingly, as the switching signal PRECH increases, current may flow from the master latch node N2 to the master fuse node N1.

The fuse unit 213 may change voltage of the master fuse node N1 depending on whether or not a master fuse M_FUSE is programmed based on current flowing through the switch unit 211. The master fuse M_FUSE may be an anti-fuse. If current flows through the switch unit 211 to the master fuse node N1 and the master fuse M_FUSE has not been programmed by the current and thus has a higher resistance, voltage of the master fuse node N1 increases. When the master fuse M_FUSE is programmed by the current and thus has a lower resistance, the voltage of the master fuse node N1 decreases close to a ground voltage VSS and the voltage is maintained at this level.

The fuse unit 213 may include an NMOS transistor MN2.

Voltage VPP may be applied to a gate of the NMOS transistor MN2, so that the voltage of the master fuse node N1 is maintained at a given level during the fuse programming operation, regardless of whether a higher voltage is applied thereto through pads from an external source.

The latch unit 215 may precharge the master latch node N2 with the source voltage VCC, and may latch voltage of the master latch node N2. Accordingly, whether the master fuse M_FUSE is programmed may be determined by an output signal from the latch unit 215.

The latch unit 215 may include three PMOS transistors MP1, MP2 and MP3, two NMOS transistors MN3 and MN4, and an inverter INV.

As the source voltage VCC increases during the initial duration period, the latch unit 215 may precharge the master latch node N2. At this point, a latch signal VCCH may maintain a low level while the source voltage VCC is increasing, and the latch signal VCCH may transition to a high level when the source voltage VCC reaches and maintains a constant level. Because the latch signal VCCH is low level in the initial duration period, the voltage of the master latch node N2 gradually increases with the gradual increase of the source voltage VCC. Thereafter, the voltage of the master latch node N2 may be determined according to whether the master fuse M_FUSE has been successfully programmed, and the latch signal VCCH transitions to a high level to latch the voltage of the master latch node N2.

If the master fuse M_FUSE has been not programmed and thus has a higher resistance, a current path may be formed through the PMOS transistors MP1 and MP2 because the latch signal VCCH has a low level when the source voltage VCC starts to increase. The switching signal PRECH may increase when the source voltage VCC increases, and thus current flows through the PMOS transistors MP1 and MP2 and the NMOS transistor MN1 toward the master fuse node N1; and because the source voltage VPP may be applied to the gate of the NMOS transistor MN2, current may flow toward the master fuse M_FUSE. However, because the master M_FUSE is not programmed and thus has a higher resistance, the voltage of the master fuse node N1 may increase. The NMOS transistor MN1 may electrically connect the master fuse node N1 and the master latch node N2 through the switching signal PRECH, and thus the voltage of the master latch node N2 may increase with an increase in the voltage of the master fuse node Ni. As the source voltage VCC becomes stable, the latch signal VCCH may become a high level. Accordingly, the PMOS transistor MP2 may be turned off and the NMOS transistor MN3 may be turned on. As the voltage of the master latch node N2 increases, the inverter INV may output a low signal. Accordingly, the PMOS transistor MP3 may be turned on and the NMOS transistor MN4 may be turned off, thereby stabilizing the voltage of the master latch node N2 at a high level. At this point, the NMOS transistor MN3 that is in a turned-on state, the inverter INV, the PMOS transistor MP3 and the NMOS transistor MN4 may be regarded as a latch circuit. Although the foregoing operations have been described as being performed in a specific sequence, the operations may be performed simultaneously or in different sequences.

If the master fuse M_FUSE is programmed and thus has a lower resistance, a current path may be formed through the PMOS transistors MP1 and MP2 because the latch signal VCCH has a low level when the source voltage VCC begins to increase. The switching signal PRECH may increase with the increase of the source voltage VCC, and thus current may flow through the PMOS transistors MP1 and MP2 and the NMOS transistor MN1 toward the master fuse node N1; and because the source voltage VPP may be applied to the gate of the NMOS transistor MN2, current may flow toward the master fuse M_FUSE. However, because the master M_FUSE is programmed and thus has a lower resistance, the voltage of the master fuse node N1 cannot increase above a given level. The NMOS transistor MN1 may electrically connect the master fuse node N1 and the master latch node N2 through the switching signal PRECH, and thus the voltage of the master latch node N2 decreases according to the voltage of the master fuse node N1. As the source voltage VCC becomes stable, the latch signal VCCH may become a high level. Accordingly, the PMOS transistor MP2 may be turned off and the NMOS transistor MN3 may be turned on. The voltage of the master latch node N2 may decrease, and thus the inverter INV may output a high signal. Accordingly, the PMOS transistor MP3 may be turned off and the NMOS transistor MN4 may be turned on, thereby stabilizing the voltage of the master latch node N2 at a low level. At this point, the NMOS transistor MN3 that is in a turned-on state, the inverter INV, the PMOS transistor MP3 and the NMOS transistor MN4 may be regarded as constituting a latch circuit. Although the foregoing operations have been described as being performed in a specific sequence, the operations may be performed simultaneously or in different sequences.

The master fuse circuit 210 may output a low signal when the master fuse M_FUSE is programmed and output a high signal when the master fuse M_FUSE is not programmed.

Figure 3:
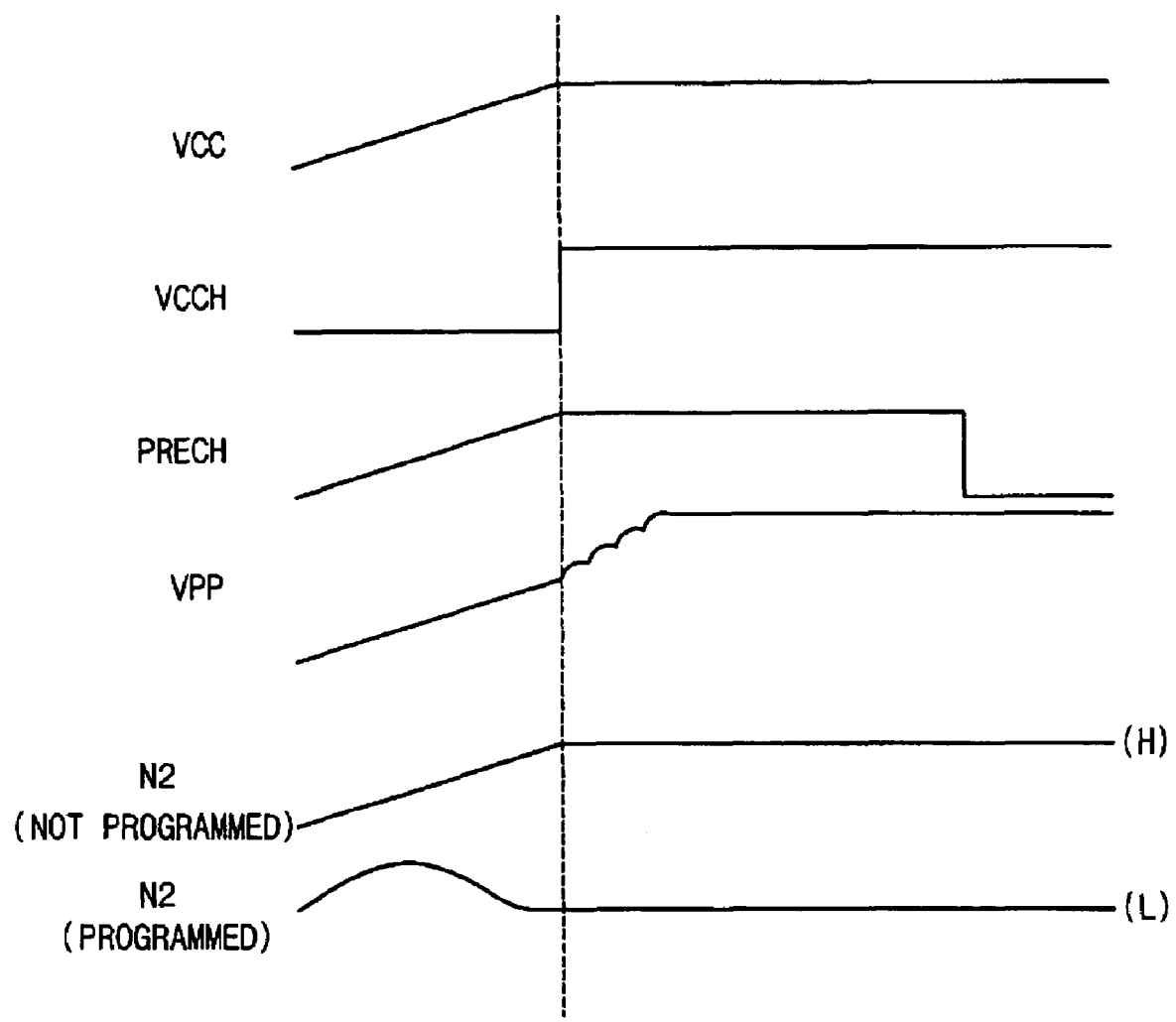
FIG. 3 is a timing diagram illustrating an operation of a second fuse circuit illustrated in FIG. 2.

FIG. 3 is a timing diagram illustrating an operation of the master fuse circuit 210 in FIG. 2.

Referring to FIGS. 2 and 3, the source voltage VCC may increase up to a given level and maintain that level. For example, the given level may be in a range of 2.8 to 3.3 V.

The latch signal VCCH may transition to a high level at a time when the source voltage is stabilized. Accordingly, the latch unit 215 of the master latch circuit 210 may latch the voltage of the master latch node N2.

The switching signal PRECH may increase with the increase of the source voltage VCC and be maintained a constant level when the source voltage VCC maintains a constant level. The switching signal PRECH may maintain the constant level and transition to a low level after an elapse of a given amount of time.

The voltage VPP may increase with the increase of the source voltage VCC, and when the source voltage VCC maintains a constant level, VPP may be generated by boosting the constant source voltage VCC. For example, the boosted voltage may be 4.1 V or higher.

When the master fuse M_FUSE is not programmed, the voltage of the master latch node N2 may gradually increase and maintain a high level after the latch signal VCCH transitions to the high level.

When the master fuse M_FUSE is programmed, the voltage of the master latch node N2 may initially increase and decrease to maintain a low level after the latch signal VCCH transitions to the high level.

Referring to FIG. 2, the test signal generating circuit 220 may receive a control signal MRS and an output signal from the master fuse circuit 210. The control signal may be a mode register set (MRS) signal.

Using the MRS signal, the test signal generating circuit 220 may generate a test signal TEST to test whether the address fuse has been properly programmed, regardless of a programming status of the master fuse M_FUSE.

In an example embodiment, the test signal generating circuit 220 may be configured with an OR gate to perform an OR operation on the control signal MRS and the output signal of the master fuse circuit 210.

Accordingly, the test signal generating circuit 220 may activate the test signal TEST when either the control signal MRS or the output signal of the master fuse circuit 210 is activated.

The address fuse circuit 230 may include two or more determining units 231 and 235, two or more XNOR gates XNOR1 and XNOR2, and an AND gate.

The determining units 231 and 235 may have the same configuration and may operate in a similar manner as the master fuse circuit 210. That is, the determining unit 231 may output a low signal when an address fuse A_FUSE1 is not programmed, and output a high signal when the address fuse A_FUSE1 is programmed. Likewise, the determining unit 235 may output a low signal when an address fuse A_FUSE2 is not programmed, and output a high signal when the address fuse A_FUSE2 is programmed.

Four addresses can be generated using the two address fuses A_FUSE1 and A_FUSE2. That is, a state corresponding to 00/01/10/11 addresses may be generated by properly programming the two address fuses.

The XNOR gate XNOR1 may check whether the state of the address fuse A_FUSE1 corresponds to an address bit ADDR1.

The XNOR gate XNOR2 may check whether the state of the address fuse A_FUSE2 corresponds to an address bit ADDR2.

For example, when the address fuses A_FUSE1 and A_FUSE2 are not programmed, both the address bits ADDR1 and ADDR2 may correspond to a state "0."

TABLE 1

| Fuse State | | Address | |
|---|---|---|---|
| A_FUSE2 | A_FUSE1 | ADDR2 | ADDR1 |
| X | X | 0 | 0 |
| X | 0 | 0 | 1 |
| 0 | X | 1 | 0 |
| 0 | 0 | 1 | 1 |

Table 1 above illustrates an example of the relationship between the address fuses A_FUSE and A_FUSE2 and the address bits ADDR1 and ADDR2.

In Table 1, "X" represents a state where the fuse is not programmed and thus is electrically opened, and "0" represents a state where the fuse is programmed and thus is electrically shorted.

Although the two address fuses and two address bits have been illustrated in FIG. 2 and Table 1, example embodiments of the present invention are not limited thereto, and any number of address fuses (or address bits) may be used.

When the address fuse A_FUSE1 corresponds to the address bit ADDR1, the XNOR gate XNOR1 may output an active signal.

Likewise, when the address fuse A_FUSE2 corresponds to the address bit ADDR2, the XNOR gate XNOR2 may output an active signal.

The XNOR gate XNOR1 may be enabled when the address fuse A_FUSE is not programmed and "0" is applied to the address bit ADDR1. Also, the XNOR gate XNOR1 may be enabled when the address fuse A_FUSE1 is programmed and "1" is applied to the address bit ADDR1.

Likewise, the XNOR gate XNOR2 may be enabled when the address fuse A_FUSE2 is not programmed and "0" is applied to the address bit ADDR2. Also, the XNOR gate XNOR2 may be enabled when the address fuse A_FUSE2 is programmed and "1" is applied to the address bit ADDR2.

The AND gate may receive and perform an AND operation on the test signal TEST and output signals of the XNOR gates XNOR1 and XNOR2, and may output the resulting signal to an output terminal OUT. That is, the AND gate may output an active signal to the output terminal OUT only when the test signal TEST and both the output signals of the XNOR gates XNOR1 and XNOR2 are active. The XNOR gates XNOR1 and XNOR2 may be enabled only when the corresponding address fuses may be programmed to correspond to the applied address bits. Consequently, the signal output to the output terminal OUT may be active only when the address fuses are programmed to correspond to the address bits and the test signal TEST is active.

The test signal TEST may be active when the control signal MRS is active or when the master fuse M_FUSE is programmed, the verifying circuit may determine the proper programming of the address fuses A_FUSE1 and A_FUSE2 by activating the control signal MRS even when the master fuse M_FUSE is not programmed. In other words, the verifying circuit may determine the proper programming of the address fuses A_FUSE1 and A_FUSE2 based on the control signal MRS regardless of the program status of the master fuse M_FUSE.

FIG. 4 is a diagram of a circuit to verify fuse programming according to another example embodiment of the present invention.

Referring to FIG. 4, the verifying circuit may include a first fuse circuit 210, a test signal generating circuit 220, and a second fuse circuit 430. For explanation purposes, the first fuse circuit may be a master fuse circuit, and the second fuse circuit may be an address circuit. It is understood that the designation of the first and second fuse circuit may be interchanged.

The master fuse circuit 210 and the test signal generating circuit 220 may be identical to those illustrated in FIG. 2.

The address fuse circuit 430 may include determining circuits 431 and 435, which may be substantially similar to the determining circuits 231 and 235 of the address fuse circuit 230 with the exception that determining circuits 431 and 435 may further include NMOS transistors 432 and 436, respectively; gates of the respective NMOS transistors 432 and 436 may receive the test signal TEST.

When the test signal TEST is not active, the NMOS transistor 432 may be turned off and thus the determining circuit 431 outputs a low signal irrespective of the fuse programming.

When the test signal TEST is activated, the NMOS transistor 432 may be turned on and the determining circuit 431 operates similarly to the determining circuit 231 of FIG. 2.

Likewise, when the test signal TEST is not activated, the NMOS transistor 436 may be turned off and thus the determining circuit 435 outputs a low signal irrespective of the fuse programming.

When the test signal TEST is activated, the NMOS transistor 436 may be turned on and the determining circuit 435 operates similarly to the determining circuit 235 of FIG. 2.

XNOR gates XNOR1 and XNOR2 of FIG. 4 may be similar to those illustrated in FIG. 2.

Unlike the AND gate illustrated in FIG. 2, an AND gate does not receive the test signal TEST, buy may only receive output signals of the XNOR gates XNOR1 and XNOR2.

The verifying circuit illustrated in FIG. 4 may generate an output signal on a status of the A_Fuse1 and A_Fuse2 only when the test signal TEST is active. That is, when the test signal TEST is not activated, all of the determining circuits 431 and 435 output a low signal, i.e., "0." Accordingly, when the address bits ADDR1 and ADDR2 are both "0", a high signal, i.e., "1," may be output to the output terminal OUT irrespective of whether or not the address fuses A_FUSE1 and A_FUSE2 are programmed.

Accordingly, in order to test the results of the address fuse programming, the test signal TEST must be active irrespective of the output signal of the master fuse circuit 210.

The verifying circuit illustrated in FIG. 4 may be different in design from the verifying circuit illustrated in FIG. 2 in the configuration of the address fuse circuit, but may perform the same basic functions when the test signal TEST is active.

A source voltage VCC, a switching signal PRECH and a latch signal VCCH of the master fuse circuit 210 may have a slight time lag with respect to that of the address fuse circuit 430.

Although example embodiments of the present invention have been described with respect to a programmed fuse that is nearly shorted and the non-programmed fuse is nearly opened, it is not limited to this case. For example, example embodiments of the present invention can also be applied to the case where the programmed fuse is nearly opened and the non-programmed fuse is nearly shorted.

Also, the control signal is not limited to the mode register set signal. That is, the control signal may be externally provided or internally generated by various methods.

As described above, it is possible to program the master fuse based on the results of the address fuse programming.

Accordingly, the master fuse may be programmed to prevent the unsuccessfully-programmed address fuse from being used. Consequently, it is possible to prevent unnecessary discarding of defective semiconductor memory devices. In particular, a defective semiconductor memory device may be efficiently repaired when the anti-fuse is used to perform the fuse programming at a package level, thereby to increase the productivity of the semiconductor memory device manufacture.

While the present invention has been described with reference to the example embodiments, it will be apparent to those skilled in the art that various changes and modifications may be made without departing from the scope of the present invention.

What is claimed is:

1. A method of repairing a defective memory cell, the method comprising:
   programming a first fuse;
   testing whether the first fuse has been successfully programmed; and
   programming a second fuse based on a test result of the first fuse.

2. The method of claim 1, wherein the first fuse is an address fuse and the second fuse is a master fuse.

3. The method of claim 1, wherein, regardless of a programming status of the second fuse, the first fuse is tested with a control signal.

4. The method of claim 3, wherein the control signal is a mode register set signal.

5. The method of claim 1, wherein if the first fuse has been improperly programmed, the second fuse is programmed to prevent the improperly-programmed first fuse from being used.

6. The method of claim 1, further comprising testing whether the second fuse has been successfully programmed.

7. The method of claim 1, wherein repairing the defective memory cell occurs at a package level.

8. The method of claim 1, wherein the first and second fuses are programmed separately.

9. A verifying circuit, comprising:
   a first fuse circuit configured to determine whether a first fuse has been programmed;
   a test signal generating circuit configured to generate a test signal based on a control signal and an output signal from the first fuse circuit; and
   a second fuse circuit configured to test whether a plurality of second fuses are programmed based on the test signal.

10. The circuit of claim 9, wherein the first fuse circuit is a master fuse circuit, the first fuse is a master fuse, the second fuse circuit is an address fuse circuit, and each of the plurality of second fuses is an address fuse.

11. The circuit of claim 10, wherein the address fuse is an anti-fuse.

12. The circuit of claim 9, wherein the control signal is a mode register set signal.

13. The circuit of claim 9, wherein the test signal generating circuit includes an OR gate.

14. The circuit of claim 9, wherein the test signal is active if the first fuse is programmed or if the control signal is active.

15. The circuit of claim 9, wherein the second fuse circuit activates an output signal if the test signal is active and the plurality of second fuses are programmed.

16. The circuit of claim 9, wherein the first fuse circuit includes:

a first switch unit configured to switch between a first fuse node and a first latch node;

a first fuse unit configured to change a voltage of the first fuse node depending on a current flowing through the first switch unit based on whether the first fuse is programmed; and a first latch unit configured to precharge the first latch node and configured to latch a voltage of the first latch node.

17. The circuit of claim 9, wherein the second fuse circuit includes:

a plurality of determining circuits, each of the plurality of determining circuits corresponding to one of the plurality of second fuses; and a plurality of XNOR gates corresponding to the plurality of determining circuits to compare signals corresponding to the plurality of second fuses with output signals of the plurality of determining circuits.

18. The circuit of claim 17, wherein each of the plurality of determining circuits include:

a second switch unit configured to switch between a second fuse node and a second latch node;

a second fuse unit configured to change a voltage of the second fuse node depending on a current flowing through the second switch unit based on whether the second fuse is programmed; and a second latch unit configured to precharge the second latch node and configured to latch a voltage of the second latch node.

19. The circuit of claim 18, further comprising a logic circuit configured to receive the test signal and output signals of the plurality of XNOR gates.

20. The circuit of claim 17, wherein each of the plurality of determining circuits is configured to receive an output of the test generating circuit.

21. The circuit of claim 18, wherein each of the plurality of determining circuits further includes a switching transistor to switch between the second switch unit and a corresponding one of the plurality of second fuses, based on the test signal.

22. The circuit of claim 21, wherein the second fuses are tested if the test signal is active.

23. A verifying circuit, comprising:

a first fuse circuit configured to determine whether a first fuse has been programmed, the first fuse circuit including:

a first switch unit configured to switch between a first fuse node and a first latch node;

a first fuse unit configured to change a voltage of the first fuse node depending on a current flowing through the first switch unit based on whether the first fuse is programmed; and a first latch unit configured to precharge the first latch node and configured to latch a voltage of the first latch node;

a test signal generating circuit configured to generate a test signal based on a control signal and an output signal from the first fuse circuit; and a second fuse circuit including a plurality of determining circuits configured to test whether a plurality of second fuses are programmed based on the test signal, each of the plurality of determining circuits including:

a second switch unit configured to switch between a second fuse node and a second latch node;

a second fuse unit configured to change a voltage of the second fuse node depending on a current flowing through the second switch unit based on whether each of the plurality of second fuses is programmed; and a second latch unit configured to precharge the second latch node and configured to latch a voltage of the second latch node.

24. The circuit of claim 23, wherein the first fuse circuit is a master fuse circuit, the first fuse is a master fuse, the second fuse circuit is an address fuse circuit, and each of the plurality of the second fuses is an address fuse.

* * * * *